United States Patent
Barou

[11] Patent Number: 6,054,880
[45] Date of Patent: Apr. 25, 2000

[54] CIRCUIT WITH HIGH-VOLTAGE OUTPUT STAGE

[75] Inventor: Michel Barou, Voreppe, France

[73] Assignee: SGS-Thomson Microelectronics S.A., Gentilly, France

[21] Appl. No.: 09/059,172

[22] Filed: Apr. 13, 1998

[30] Foreign Application Priority Data

Apr. 24, 1997 [FR] France ................................ 97-05242

[51] Int. Cl.$^7$ ...................................................... H03B 1/00
[52] U.S. Cl. ........................................... 327/109; 327/427
[58] Field of Search ................................. 327/108, 109, 327/110, 111, 112, 427, 543

[56] References Cited

U.S. PATENT DOCUMENTS

| | | | |
|---|---|---|---|
| 5,113,087 | 5/1992 | Ueno | 307/263 |
| 5,631,588 | 5/1997 | Bertolini | 327/108 |
| 5,796,276 | 8/1998 | Phillips et al. | 327/108 |

FOREIGN PATENT DOCUMENTS 0 130 082 A2   1/1985   European Pat. Off. ..... H03K 19/094

OTHER PUBLICATIONS

G.C. Gerhard, "Surgical Electrotechnology: Quo Vadis?", *IEEE Transactions on Biomedical Engineering*, vol. BME–31, No. 12, Dec. 1984, pp. 787–791.

McAndrew et al., "BiCMOS $h_{fe}$ Degradation: Causes and Circuit Solution", *1994 Bipolar/BICMOS Circuits & Technology Meeting 13.1*, (1994), pp. 197–200.

Hadri et al., "Impedance Boosting Techniques Based on BiCMOS Technology", *IEEE Journal of Solid–State Circuits*, vol. 28, No. 2, (Feb. 1, 1993), pp. 157–161.

Pernici et al., "A CMOS Low–Distortion Fully Differential Power Amplifier With Double Nested Miller Compensation", *IEEE Journal of Solid–State Circuits*, vol. 28, No. 7, (Jul. 1, 1993), pp. 758–763.

*Primary Examiner*—Jeffrey Zweizig
*Attorney, Agent, or Firm*—Allen, Dyer, Doppelt, Milbrath & Gilchrist, P.A.

[57] ABSTRACT

An integrated circuit includes a high-voltage output stage. The high-voltage output stage, in turn, comprises a first MOS transistor, a second MOS transistor, a current source and a diode. This high-voltage output stage can be improved by the addition of a third MOS transistor, a first bipolar transistor and, possibly, a second bipolar transistor.

23 Claims, 2 Drawing Sheets

CIRCUIT WITH HIGH-VOLTAGE OUTPUT STAGE

FIELD OF THE INVENTION

The invention relates to integrated circuits having a high-voltage output stage. More specifically, the invention relates to circuits that have to output relatively high voltages.

BACKGROUND OF THE INVENTION

For cathode-ray tube control, circuits having high output voltages are necessary as the control voltages of the tubes can go beyond 200 V. The control circuits of such tubes are generally amplifiers. However, for monochromatic monitors, it is possible to use simple logic gates.

For a clearer explanation of the problems encountered, reference may be made to FIG. 1 which will be well known to those skilled in the art and will provide a schematic view of an amplifier 1 controlling the emission cathode of a cathode-ray tube 2. An electrical model of the cathode of the cathode-ray tube is provided by a capacitor 3. The resistors R1 and R2 are used to define a factor of amplification equal to R1/R2. The amplifier 1 is supplied with two supply voltages, VCC (for example 12 V) and VDD (for example 240 V).

As is known to those skilled in the art, the amplifier 1 has an input stage 4, an amplifier stage 5 and an output stage 6. The passage from the low voltage (12 V) to the high voltage (240 V) is done in the output stage to reduce the consumption and heating of the amplifier 1. Naturally, there are other variants and the number of stages of the amplifier 1 may vary.

Conventionally, the cathode of the tube 2 does not react above a voltage of about 200 V and gets saturated below a voltage of about 50 V. Thus, a pixel that is illuminated to the maximum intensity with an extinguished pixel on each side is electrically expressed at the input of the cathode by a voltage square-wave of 50 to 200 V. If, furthermore, we look at a screen with 640 lines of 1024 pixels scanned at 100 Hz, a voltage square-wave time of 15 ns is obtained. The slew rate at output of the amplifier 1 should therefore be at least equal to 10 V/ns. Furthermore, the value of the capacitor 3 is conventionally 12 pF, which necessitates the production of a current of at least 120 mA.

A reliable embodiment of cathode driving circuits uses very costly hybrid technologies. Monolithic embodiments have been made in bipolar technologies to reduce the cost of the circuits. However, the bipolar technologies have fairly high power consumption and suffer from problems of switch-over speed with the PNP transistors. Furthermore, the bipolar transistors have switching times that greatly depend on the current flowing through them.

SUMMARY OF THE INVENTION

An object of the invention is to provide a new approach to high-voltage output stages that uses a technology combining the bipolar transistors and the MOS transistors. The invention proposes an assembly that is appropriate for the requirements indicated here above, consuming little energy at rest and using MOS transistors to provide for major energy transfers. More particularly, the output stage preferably comprises a low-voltage input, a high-voltage output, a first MOS transistor having its gate connected to the low voltage input and its source connected to a first reference voltage; a second MOS transistor having its drain connected to a second reference voltage and its source connected to the high-voltage output; a current source having a first terminal connected to the second reference voltage and a second terminal connected to the gate of the second MOS transistor; and a diode having its first terminal connected to the gate of the second MOS transistor and its second terminal connected to the source of the second MOS transistor.

To improve the switch-over speed, it is preferable that the high-voltage output stage should also have a third MOS transistor having its drain connected to the high-voltage output, its gate connected to a third reference voltage and its source connected to the drain of the first MOS transistor. It is also possible to add a first bipolar transistor having its collector connected to the first terminal of the diode, its base connected to the third reference voltage and its emitter connected to the drain of the first MOS transistor. If necessary, the emitter of the first bipolar transistor may be connected to the drain of the first MOS transistor by means of a resistor.

In one improvement, the high-voltage output stage comprises a second bipolar transistor having its base connected to the third reference voltage, its collector connected to the high-voltage output and its emitter connected to the emitter of the first bipolar transistor. In one variant of this improvement, the emitter of the first bipolar transistor is connected to the drain of the first MOS transistor by means of a first resistor and a second resistor that are series-connected and create a node between the first and second resistors. The high-voltage output stage preferably comprises a second bipolar transistor having its base connected to the third reference voltage, its collector connected to the high-voltage output and its emitter connected to the node.

To reduce the consumption of the output stage, a current source is used, giving a current that is a function of the voltage present at the low-voltage input. To prevent certain overvoltages, it is preferable for the diode to be a Zener diode. For use with relatively high voltages, it will be preferred that the first, second and third MOS transistors should be NVDMOS transistors.

BRIEF DESCRIPTION OF THE DRAWINGS

The invention will be understood more clearly and other particular features and advantages shall appear from the following description, given with reference to the appended drawings, of which.

DETAILED DESCRIPTION OF THE PREFERRED EMBODIMENT

Figure 1:
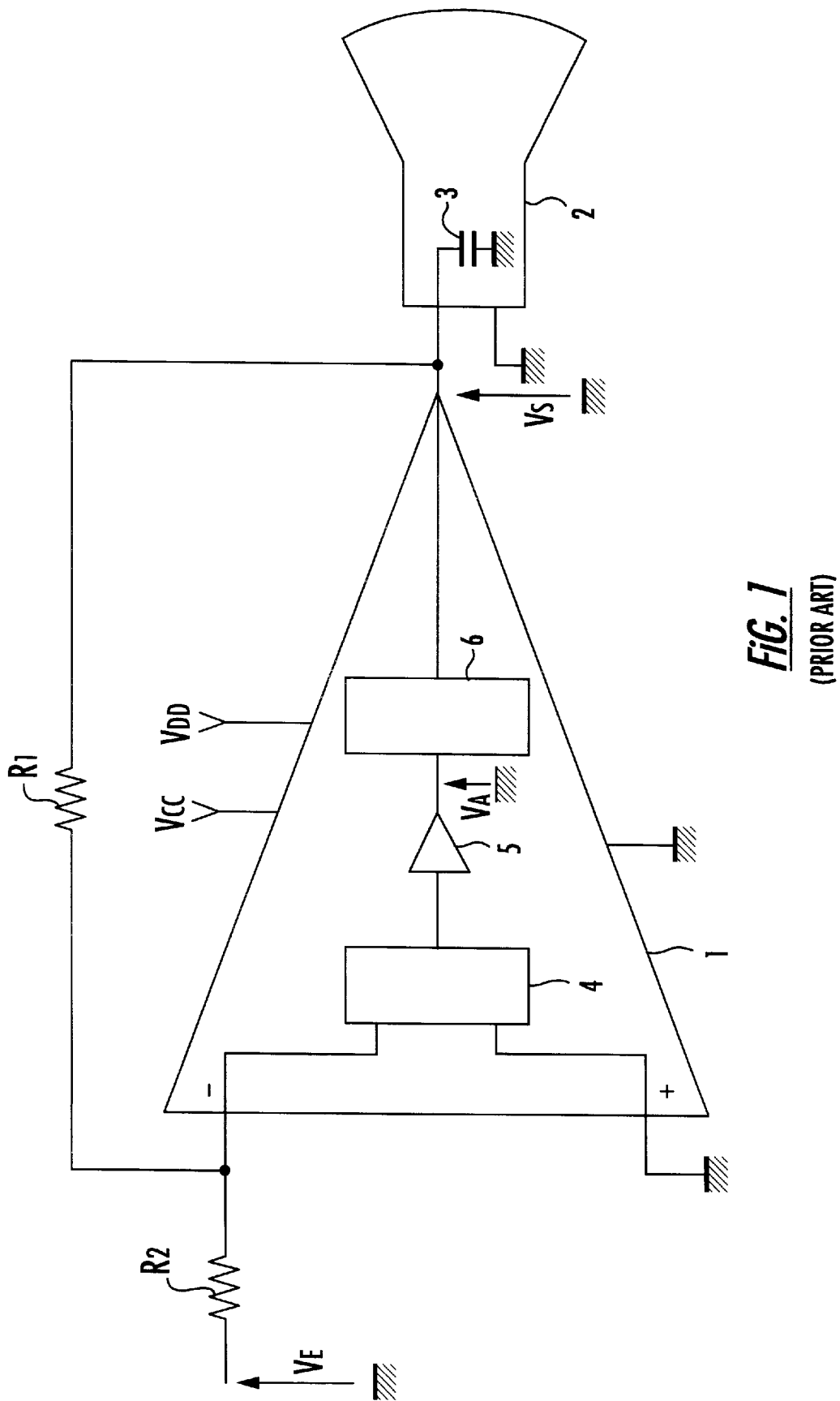
FIG. 1 gives a schematic view of a prior art amplifier.

The drawing of FIG. 1 can be used to locate the invention. The amplifier 1 has an inverter input, a non-inverter input and an output. A resistor R1 is connected between the inverter input and the output. A first terminal of a resistor R2 is connected to the inverter input of the amplifier 1. A second terminal of the resistor R2 receives an input signal Ve. The non-inverting input of the amplifier 1 is connected to ground. The output of the amplifier 1 is connected to the cathode of the cathode-ray tube 2 and gives a voltage Vs. Those skilled in the art will know that, in the linear operating mode, there is the following relationship: Vs=−Ve*R1/R2. In the present example, only positive voltages VCC and VDD are used to supply the amplifier 1. Those skilled in the art will understand that, in this example, Ve must be negative.

Furthermore, the amplifier 1 has a differential input stage 4, an amplifier stage 5 and a high-voltage output stage 6. This structure may have numerous variants. To explain the functioning of the invention, we shall consider the voltage Va at the output of the amplifier stage 5 and at the input of the output stage 6. The voltage Va is equal to k*(V+−V⁻), with k being a relatively high amplifier coefficient (in the range of 100,000), V+ being the voltage at the non-inverting input, and V− being the voltage at the inverting input. The internal structure of the differential stage 4 and the amplifier stage 5 is of a known type with a response time that is negligible as compared with the response time of the output stage 6. It is therefore assumed that the voltage Va reacts instantaneously with the input voltages V+ and V−. Furthermore, since the supply voltage VCC is 12 V in the present example, the voltage Va will range from 0 to 12 V.

Figure 2:
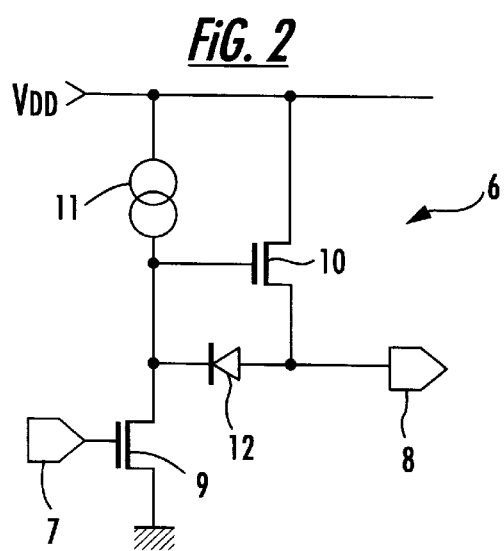
FIGS. 2 to 4 give a schematic view of alternative embodiments of the invention.

FIG. 2 gives a schematic view of the high-voltage output stage 6 made according to the invention in a simplified manner. A low-voltage input terminal 7 is used to receive the voltage Va given by the amplifier stage 5. A high-voltage output terminal 8 corresponds to the output of the amplifier 1. In FIG. 2, the high-voltage output stage 6 has a first MOS transistor 9 and a second MOS transistor 10, a current source 11 and a diode 12. The first MOS transistor 9 has its gate connected to the low-voltage input terminal 7 and its source connected to a first reference voltage, in the present example the ground. The second MOS transistor 10 has its drain connected to a second reference voltage (in the present example VDD equal to about 240 V), its gate connected to the drain of the first MOS transistor 9 and its source connected to the high-voltage output terminal 8. The current source 11 has a first terminal connected to the second reference voltage and a second terminal connected to the gate of the second MOS transistor 10. The diode 12 has its first terminal connected to the gate of the second MOS transistor 10 and its second terminal connected to the source of the second MOS transistor 10.

If the first and second MOS transistors 9 and 10 are standard N channel MOS transistors, then the output voltage should be limited to some tens of volts. Those skilled in the art are strongly advised to use NVDMOS MOS type transistors also known as diffused MOS transistors which easily stand up to drain-source voltages of 250 V, provided that there are higher gate-source threshold voltages. Naturally, those skilled in the art will be able to adapt the choice of the type of MOS transistors to the desired output voltage.

To explain the working of this output stage, it is assumed initially that the negative feedback resistor R1 is eliminated. It is assumed that there is a threshold voltage of the first MOS transistor 9 that corresponds to a drawing of current in the first MOS transistor 9 equal to the current given by the current source 11. There are then three possible cases:

the voltage Va present at the input terminal is higher than the threshold voltage, the voltage Va present at the input terminal is lower than the threshold voltage, or the voltage Va present at the input terminal is equal to the threshold voltage.

If the first case occurs, then all the current given by the current source 11 is drawn by the first MOS transistor 9. Any charges present at the gate of the second MOS transistor 10 are also drawn by the first MOS transistor 9 thus blocking the second MOS transistor 10. The drain-source voltage of the first MOS transistor tends to diminish to the greatest possible extent, turning the diode 12 on. The charges stored in the cathode of the tube 2 are also drawn. To obtain the desired feedback speed, it is enough to size the diode 12 and the first MOS transistor 9 so as to be able to transfer the necessary current. When the cathode is completely discharged, the voltage at the output terminal will be equal to the minimum drain-source voltage plus a diode threshold voltage.

If the second case occurs, then the first MOS transistor 9 draws only a part of the current coming from the current source 11. The part of the current coming from the current source 11 which is not drawn by the first MOS transistor 9 charges the gate of the second MOS transistor 10 and increases the gate-source voltage of the second MOS transistor 10, turning the second MOS transistor on. The second MOS transistor 10 charges the cathode of the cathode-ray tube 2 with a current that is all the higher as the gate-source voltage of the second MOS transistor 10 is great. To obtain the signal buildup reaction time, the second MOS transistor 10 should be sized to provide the current needed to charge the cathode of the tube 2.

If the third case occurs, then the first MOS transistor 9 will have its drain-source voltage increase up to the point in time when it reaches the voltage at the output terminal 8 minus the threshold voltage of the diode 12. The second MOS transistor 10 is turned off and the voltage at the output terminal 8 remains constant.

If the output stage 6 is used in an open loop, for example at the output of a logic circuit, only the first and second cases explained here above are used, the third case being very difficult to obtain. If, on the contrary, the output stage 6 works as a closed loop as indicated in the assembly of FIG. 1, the third case corresponds to the point in time at which the output voltage Vs is equal to the desired voltage, namely in the present example −Ve*R1/R2. The third case must be considered to be a quiescent state or state of equilibrium in the looped system. Since the other two cases are used in an extreme manner, namely with the first MOS transistor completely on or completely off, they correspond to transient states.

The circuit of FIG. 2 has some drawbacks. First of all, those skilled in the art will observe that the second MOS transistor 10 has its gate charged by a current. This has the effect of causing an increase in the gate-source voltage. If the transient state which corresponds to the second case lasts far too long (when the output stage is used in an open loop), then the gate-source voltage of the second MOS transistor 10 risks becoming too great, thus disrupting the gate insulator of the second MOS transistor 10. To resolve this problem, the diode 12 may be a Zener type diode to limit the gate-source voltage of the second MOS transistor 10. Furthermore, the use of a Zener type diode 12 serves firstly to avoid the need for computations to size the current source 11 and the second MOS transistor 10, and secondly as security for the use of the component which go beyond the specifications of the component (for example, with an excessively large output load). For example, the gate-source voltage of a standard MOS transistor will be limited to 2 V and the gate-source voltage of an NVDMOS transistor will be limited to 7 V.

A second drawback arises out of the sizing of the diode 12. Indeed, if we use a current source 11 that gives 2 mA, and if it is assumed that the threshold voltage of an NVDMOS transistor is 4 V and that the gate-source capacitance of an NVDMOS transistor sized to let through for example 120 mA is 0.5 pF, this produces a time delay of 1 ns before the second MOS transistor 10 becomes conductive if this second MOS transistor 10 is of an NVDMOS type. Now, in FIG. 2, the diode 12 must be sized to let through a high current, thus creating substantial parasitic capacitance at the terminals of the diode 12 when this diode is off. To let through a current of 120 mA, the parasitic capacitance is in the range of 6 pF, producing a time delay of about 13 ns. Given the performance characteristics required of the circuit, it is preferable to reduce this parasitic capacitance. The effect produced by the parasitic capacitance of the diode 12 is attenuated but always present if standard MOS transistors are used, for the threshold voltage of a standard MOS transistor is in the range of some picofarads. Those skilled in the art will note that, if the effect of the parasitic capacitance of the diode 12 is eliminated, the risk of gate-source overvoltage in the second MOS transistor is increased.

Figure 3:
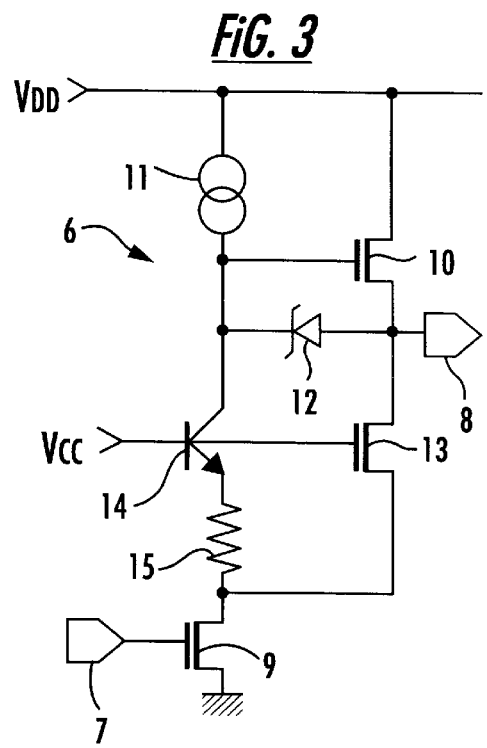

FIG. 3 shows an embodiment of the invention resolving the problems indicated hereabove. FIG. 3 repeats all the elements of FIG. 2, with the diode 12 being a Zener type diode. In FIG. 3, the gate of the second MOS transistor 10 is no longer directly connected to the drain of the first MOS transistor 9. In this FIG. 3, the high-voltage output stage 6 furthermore comprises a third MOS transistor 13, a first bipolar transistor 14 and a first resistor 15.

The third MOS transistor 13 has its drain connected to the high-voltage output 8, its gate connected to a third reference voltage (for example VCC equal to 12 V) and its source connected to the drain of the first MOS transistor 9. The first bipolar transistor 14 has its collector connected to the first terminal of the diode 12, and its base connected to a third reference voltage. The first resistor 15 has a first terminal connected to the emitter of the first bipolar transistor 14 and a second terminal connected to the drain of the first MOS transistor 9.

The working of the circuit of FIG. 3 is similar to the working of FIG. 2. The following three cases may be distinguished:

the voltage Va present at the input terminal is higher than the threshold voltage, the voltage Va present at the input terminal is lower than the threshold voltage, or the voltage Va present at the input terminal is equal to the threshold voltage.

If the first case occurs, the current drawn by the first MOS transistor is divided into a first current and a second current. The first current draws the current from the current source 11, the charges if any that may be present at the gate of the second MOS transistor 10 and an additional biasing current coming from the output terminal 8 by means of the first resistor 15 and the first bipolar transistor 14. The second current is drawn by means of the second MOS transistor 13. The sum of the first and second currents corresponds to the maximum current necessary at the output terminal plus the current given by the source 11. The current going through the diode 12 is equal to the additional biasing current which is far smaller than the maximum output current. This additional biasing current is determined to cause a gate-source voltage at the terminals of the third MOS transistor 13 equal to the voltage needed to make it sufficiently conductive to draw the maximum current at the output terminal 8.

If the second case occurs, the second MOS transistor gets charged as shown in FIG. 2, but as soon as the gate-source voltage reaches the avalanche voltage of the Zener diode 12, the current of the source 11 is sent to the output terminal 8.

If the third case occurs, the first MOS transistor 9 will be conductive just to absorb the current from the source 11. The second and third MOS transistors 10 and 13 are off.

Those skilled in the art will understand that the sizing of the first resistor 15 should be such that the voltage at the terminals of the resistor, when it is crossed by the current of the source 11, plus the base-emitter voltage of the first bipolar transistor 14 should be smaller than the threshold voltage of the third MOS transistor 13. Furthermore, this first resistor will define the additional biasing current. For example, for NVDMOS type transistors and a current source giving 2 mA, it is possible to take a 1 kΩ resistor which will fix the additional biasing current at about 4 mA. The surface are, and, therefore, the parasitic capacitance of the diode 12 is divided by 30 and is equal to about 0.2 pF.

Variants of FIG. 3 are possible, but may not perform as well. If standard MOS transistors are used, the first resistor 15 may be eliminated. The base-emitter voltage of the first bipolar transistor 15 will be used as a control voltage for the third MOS transistor 13. The current flowing through the first bipolar transistor must be greater, thus reducing the surface area of the diode 12 to a smaller extent.

Another possibility includes eliminating the first bipolar transistor 14. In this case, the gate of the third MOS transistor is connected to the first terminal of the diode 12 and to the first terminal of the first resistor 15. The current in the diode may be reduced more significantly than in FIG. 3. However in this case, the gate-drain capacitance of the third MOS transistor 13, which is substantially equal to the gate-source capacitance of the second MOS transistor 10, is added in parallel to the diode 12.

Figure 4:
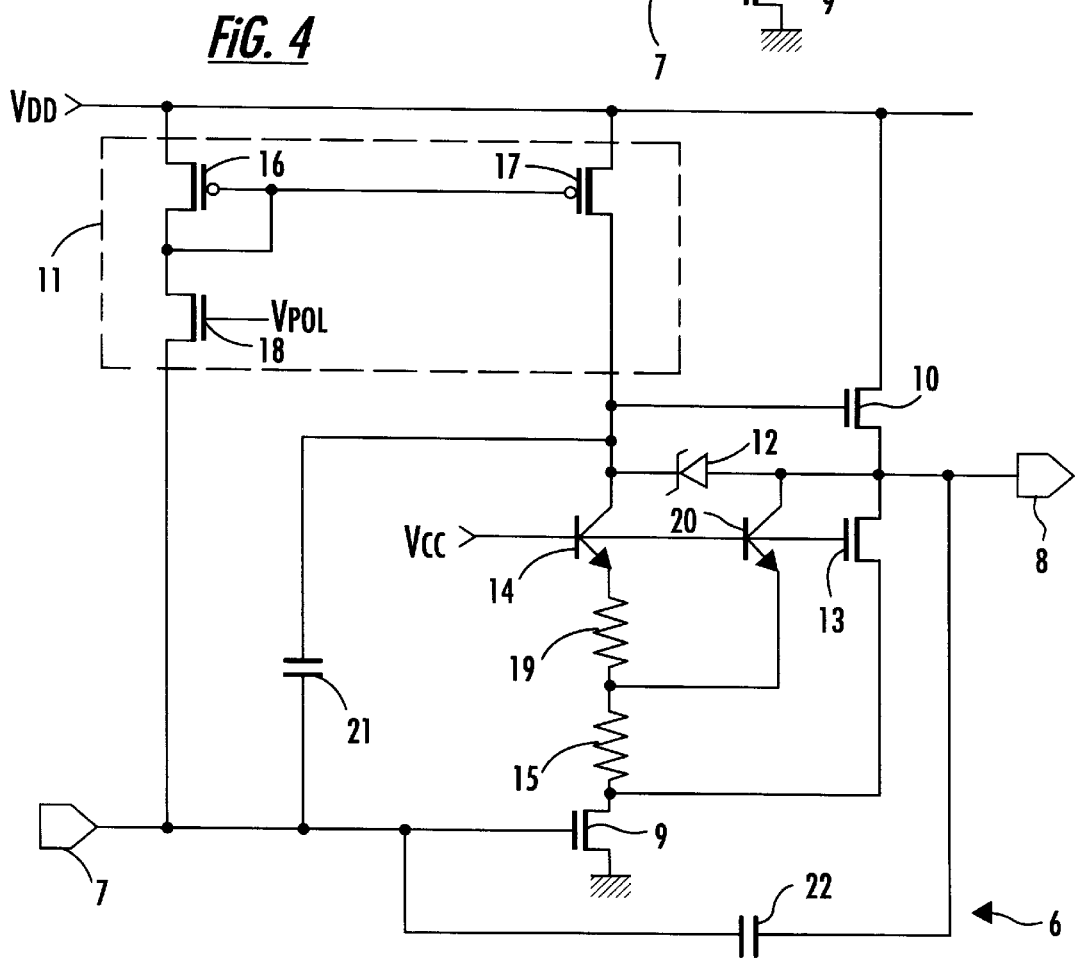

The diagram of FIG. 4 corresponds to perhaps the most efficient embodiment of the invention. The diagram of FIG. 4 is based on the diagram of FIG. 3, improving it by the addition of complementary devices. The complementary devices are combined in one and the same diagram, but may be used independently of one another.

A first improvement includes the use of a current source 11 controlled as a function of the input voltage. In FIG. 4, the current source 11 has a current mirror formed by two mirror transistors 16 and 17 and a control transistor 18. The transistors 16 to 18 of the current source 11 are diffused or standard MOS transistors depending on the choices made for the first, second and third MOS transistors 9, 10 and 13. The control transistor has a channel of the same type as the first to third MOS transistors 9, 10 and 13 (in the present example an N channel) and the two current mirror transistors have a channel of a different type (in the present example a P channel). The first mirror transistor 16 has its source connected to the second reference voltage and its drain connected to its gate. The second mirror transistor 17 has its source connected to the second reference transistor, its gate connected to the gate of the first mirror transistor 16 and its drain connected to the gate of the second MOS transistor 10. The control transistor 18 has its drain connected to the drain of the first mirror transistor 16, its source connected to the input terminal 7 and its gate connected to a bias voltage Vpol. A protection resistor can be added between transistor 16 and transistor 18.

The bias voltage Vpol and the sizing of the transistor are determined to obtain the maximum current given by the source when there is a minimum voltage at the input terminal. The working of the output stage is substantially modified:

when the voltage at the input terminal 7 is greater than the threshold voltage of the first MOS transistor 9, the first MOS transistor 9 becomes conductive and draws the current needed to discharge the external load connected to the output terminal 8, the control transistor 18 is off and no current is given by the current source 11;

when the voltage at the input terminal 7 is lower than the bias voltage minus the threshold voltage of the control transistor 18, the first MOS transistor 9 is off, the control transistor 18 is on and fixes the current let through by the current source 11; and when the voltage at the input terminal 7 is between the two above-mentioned thresholds, the first MOS transistor and the control transistor 18 are off and no current flows in the output stage 6, and the voltage at the output terminal remains unchanged.

In a looped system, it is preferable to fix the bias voltage between a voltage slightly lower than the sum of the threshold voltages of the first MOS transistor 9 and of the control transistor 18 and a voltage slightly greater than the sum of the threshold voltages of the first MOS transistor 9 and of the control transistor 18. Those skilled in the art will choose this voltage when taking into account low consumption or a fast reaction of the device. Indeed, the quiescent point is determined automatically by the negative feedback loop and corresponds to an input voltage such that the first MOS transistor draws as much current as the control transistor 18 causes the current source 11 to produce. If the bias voltage is slightly below the sum of the threshold voltages, the gate-source voltages are slightly below the threshold voltages of the first MOS transistor 9 and of the control transistor 18 and said transistors 9 and 18 permit the passage only of a very low current. If the bias voltage is slightly greater than the sum of the threshold voltages, the gate-source voltage of the control transistor 18 is slightly greater than its threshold voltage and the gate-source voltage of the first MOS transistor 9 is equal to its threshold voltage, then a maximum bias current is obtained favoring the reaction speed of the device.

A second improvement includes reducing the current that flows through the diode 12 directly as understood with reference to FIG. 4. The second improvement is made by means of a second resistor 19 and a second bipolar transistor 20. The second resistor 19 is connected between the first terminal of the first resistor 15 and the emitter of the first bipolar transistor 14. The second bipolar transistor 20 has its collector connected to the output terminal 8, its base connected to the third reference voltage and its emitter connected to the first terminal of the first resistor 15.

To explain the working of the second improvement, an uncontrolled current source 11 is used. When the output stage 6 receives an input voltage that corresponds to a quiescent state, the current coming from the current source 11 goes through the first bipolar transistor 14 and the first and second resistors 15 and 19 prompt the conduction of the second bipolar transistor 20 which will draw an additional quiescent current by means of the second MOS transistor 10. If the voltage at the input terminal is greater than the threshold voltage, the drawing of current by the first MOS transistor 9 will increase the current in the first and second bipolar transistors 14 and 20. The increase of current in the first resistor 15 needed for the conduction of the third MOS transistor 13 is distributed in the first and second bipolar transistors 14 and 20. The current in the diode 12 is reduced.

The addition of the second bipolar transistor 20 prompts an increase in the consumption of the output stage 6 in operation at the quiescent point, but enables the conduction of the second MOS transistor 10 thus considerably reducing the reaction time of this second MOS transistor 10.

As shown, it is preferable to have a second bipolar transistor 20 whose emitter surface area is smaller than the emitter surface area of the first bipolar transistor 14, for example, with a ratio of four between the two emitter surface areas so as to have a quiescent current going through the second bipolar transistor 20 that is smaller than the current given by the current source 11. The second resistor 19 must be small-sized, for example 5Ω, so as not to significantly increase the quiescent current in the second bipolar transistor 20. The effect produced by the second resistor 20 includes increasing the current in the second bipolar transistor 20 exponentially with respect to the increase of the current in the first bipolar transistor 14 when the first MOS transistor 9 is highly conductive to have a current flowing through the diode 12 that is as small as possible. The addition of the second bipolar transistor 20 makes the size of the diode 12 solely dependent on the reverse current.

The second resistor 19 may be eliminated if the two above-mentioned improvements are combined since the quiescent current flowing through the first bipolar transistor 14 is greatly reduced as compared with the use of a fixed current source. In this case, it is more worthwhile to have a second bipolar transistor of the same size as the first bipolar transistor 14, or even one that is slightly bigger. Those skilled in the art will note that the combination of the above-mentioned two improvements also makes it possible to have a lack of precision in the value of the first resistor 15 that does not have any adverse affect on the efficient operation of the output stage.

In the use of a looped system, it is preferable to have a relatively stable system with well-dampened signals. To dampen oscillations if any, a first capacitor and/or a second capacitor 21 and 22 may be added. The first capacitor 21 has its first terminal connected to the input terminal 7 and its second terminal connected to the first terminal of the diode 12. The second capacitor 22 has its first terminal connected to the input terminal 7 and its second terminal connected to the output terminal 8.

Those skilled in the art will understand that numerous variants of the invention are possible. In the present example, it is essentially N channel MOS transistors that have been used because these are the transistors that are preferred in most MOS technologies. It is possible, however, to use P channel transistors instead of N channel transistors by adapting the circuit as can be done by those skilled in the art. Depending on the desired output voltages, those skilled in the art could also choose to use either standard N channel or P channel MOS transistors or NVDMOS or HVPMOS type transistors as the first to third MOS transistors 9, 10 and 13. However the use of NVDMOS transistors is recommended for a circuit used with voltages in the range of 200 to 300 V. Similarly, those skilled in the art will understand that the numerical data are quite modifiable without bringing the invention into question.

Similarly, the example relates essentially to an operational amplifier used in a closed looped form.

As stated here above, the output stage may be used in an open loop in any kind of integrated circuit.

What is claimed is:

1. An integrated circuit comprising:
   a high-voltage output stage comprising
      a low-voltage input,
      a high-voltage output,
      a first MOS transistor having a gate connected to the low-voltage input and a source connected to a first reference voltage,
      a second MOS transistor having a drain connected to a second reference voltage and a source connected to the high-voltage output, a current source having a first terminal connected to the second reference voltage and a second terminal connected to a gate of the second MOS transistor, a diode having a first terminal connected to the gate of the second MOS transistor and a second terminal connected to the source of the second MOS transistor, a third MOS transistor having a drain connected to the high-voltage output, a gate connected to a third reference voltage and a source connected to a drain of the first MOS transistor, and a first bipolar transistor having a collector connected to the first terminal of the diode, a base connected to the third reference voltage and an emitter connected to the drain of the first MOS transistor.

2. An integrated circuit according to claim 1, wherein the high-voltage output stage further comprises a resistor connected between the emitter of the first bipolar transistor the drain of the first MOS transistor.

3. An integrated circuit according to claim 1, wherein the high-voltage output stage comprises a second bipolar transistor having a base connected to the third reference voltage, a collector connected to the high-voltage output and an emitter connected to the emitter of the first bipolar transistor.

4. An integrated circuit according to claim 1, wherein the high-voltage stage further comprises a first resistor and a second resistor being series-connected and defining a node therebetween; wherein said first and second resistors are connected between the emitter of the first bipolar transistor and the drain of the first MOS transistor; and wherein the high-voltage output stage comprises a second bipolar transistor having a base connected to the third reference voltage, a collector connected to the high-voltage output and an emitter connected to the node between said first and second resistors.

5. An integrated circuit according to claim 1, wherein the current source gives a current that is a function of the voltage present at the low-voltage input.

6. An integrated circuit according to claim 1, wherein the diode is a Zener diode.

7. An integrated circuit according to claim 1, wherein the first, second and third MOS transistors are NVDMOS type transistors.

8. An integrated circuit according to claim 1, wherein the high voltage output stage further comprises:

a first capacitor connected between the first terminal of the diode and the low-voltage input; and a second capacitor connected between the second terminal of the diode and the low-voltage input.

9. A high-voltage output stage comprising:

a low-voltage input;

a high-voltage output;

a first MOS transistor having a gate connected to the low-voltage input and a source connected to a first reference voltage;

a second MOS transistor having a drain connected to a second reference voltage and a source connected to the high-voltage output;

a current source having a first terminal connected to the second reference voltage and a second terminal connected to a gate of the second MOS transistor;

a diode having a first terminal connected to the gate of the second MOS transistor and a second terminal connected to the source of the second MOS transistors;

a third MOS transistor having a drain connected to the high-voltage output, a gate connected to a third reference voltage and a source connected to a drain of the first MOS transistor; and a first bipolar transistor having a collector connected to the first terminal of the diode, a base connected to the third reference voltage and an emitter connected to the drain of the first MOS transistor.

10. A high-voltage output stage according to claim 9, further comprising a resistor connected between the emitter of the first bipolar transistor the drain of the first MOS transistor.

11. A high-voltage output stage according to claim 9, further comprising a second bipolar transistor having a base connected to the third reference voltage, a collector connected to the high-voltage output and an emitter connected to the emitter of the first bipolar transistor.

12. A high-voltage output stage according to claim 9, further comprising a first resistor and a second resistor being series-connected and defining a node therebetween; wherein said first and second resistors are connected between the emitter of the first bipolar transistor and the drain of the first MOS transistor; and wherein the high-voltage output stage comprises a second bipolar transistor having a base connected to the third reference voltage, a collector connected to the high-voltage output and an emitter connected to the node between said first and second resistors.

13. A high-voltage output stage according to claim 9, wherein the current source gives a current that is a function of the voltage present at the low-voltage input.

14. A high-voltage output stage according to claim 9, wherein the diode is a Zener diode.

15. A high-voltage output stage according to claim 9, wherein the first, second and third MOS transistors are NVDMOS type transistors.

16. A high-voltage output stage according to claim 9, further comprising:

a first capacitor connected between the first terminal of the diode and the low-voltage input; and a second capacitor connected between the second terminal of the diode and the low-voltage input.

17. A high-voltage output stage comprising:

a low-voltage input;

a high-voltage output;

a first MOS transistor having a gate connected to the low-voltage input and a source connected to a first reference voltage;

a second MOS transistor having a drain connected to a second reference voltage and a source connected to the high-voltage output;

a current source having a first terminal connected to the second reference voltage and a second terminal connected to a gate of the second MOS transistor;

a zener diode having a first terminal connected to the gate of the second MOS transistor and a second terminal connected to the source of the second MOS transistor;

a third MOS transistor having a drain connected to the high-voltage output, a gate connected to a third reference voltage and a source connected to a drain of the first MOS transistor; and a first bipolar transistor having a collector connected to the first terminal of the zener diode, a base connected to the third reference voltage and an emitter connected to the drain of the first MOS transistor.

18. A high-voltage output stage according to claim 17, further comprising a resistor connected between the emitter of the first bipolar transistor the drain of the first MOS transistor.

19. A high-voltage output stage according to claim 17, further comprising a second bipolar transistor having a base connected to the third reference voltage, a collector connected to the high-voltage output and an emitter connected to the emitter of the first bipolar transistor.

20. A high-voltage output stage according to claim 17, further comprising a first resistor and a second resistor being series-connected and defining a node therebetween; wherein said first and second resistors are connected between the emitter of the first bipolar transistor and the drain of the first MOS transistor; and wherein the high-voltage output stage comprises a second bipolar transistor having a base connected to the third reference voltage, a collector connected to the high-voltage output and an emitter connected to the node between said first and second resistors.

21. A high-voltage output stage according to claim 17, wherein the current source gives a current that is a function of the voltage present at the low-voltage input.

22. A high-voltage output stage according to claim 17, wherein the first, second and third MOS transistors are NVDMOS type transistors.

23. A high-voltage output stage according to claim 17, further comprising:

a first capacitor connected between the first terminal of the zener diode and the low-voltage input; and a second capacitor connected between the second terminal of the diode and the low-voltage input.

* * * * *